United States Patent
Chien et al.

(10) Patent No.: US 9,613,967 B1
(45) Date of Patent: Apr. 4, 2017

(54) MEMORY DEVICE AND METHOD OF FABRICATING THE SAME

(71) Applicant: Winbond Electronics Corp., Taichung (TW)

(72) Inventors: Yi-Hao Chien, Taichung (TW); Yoshinori Tanaka, Taichung (TW); Wei-Che Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/083,302

(22) Filed: Mar. 29, 2016

(30) Foreign Application Priority Data

Dec. 10, 2015 (CN) .......................... 2015 1 0909859

(51) Int. Cl.
  *H01L 27/108* (2006.01)
(52) U.S. Cl.
  CPC .. *H01L 27/10894* (2013.01); *H01L 27/10897* (2013.01)
(58) Field of Classification Search
  CPC .................... H01L 27/10894; H01L 27/10897
  See application file for complete search history.

(56) References Cited

U.S. PATENT DOCUMENTS

| | | |
|---|---|---|
| 2003/0102515 A1 | 6/2003 | Tran et al. |
| 2006/0202340 A1 | 9/2006 | Park et al. |
| 2008/0253160 A1 | 10/2008 | Popp et al. |
| 2011/0260288 A1 | 10/2011 | Sukekawa et al. |
| 2014/0061742 A1* | 3/2014 | Nishitani .......... H01L 27/10814 257/296 |
| 2015/0055413 A1* | 2/2015 | Alsmeier ........... G11C 14/0018 365/185.08 |
| 2016/0043090 A1* | 2/2016 | Ikebuchi ................. H01L 21/76 257/296 |
| 2016/0233297 A1* | 8/2016 | Tomoyama ......... H01L 29/0649 |

OTHER PUBLICATIONS

"Office Action of Taiwan Counterpart Application", issued on Oct. 19, 2016, p. 1-p. 6, in which the listed references were cited.

* cited by examiner

*Primary Examiner* — Christine Enad
(74) *Attorney, Agent, or Firm* — Jianq Chyun IP Office

(57) ABSTRACT

A method of fabricating a memory device includes providing a substrate having a first region and a second region. A first dielectric layer is formed on the substrate in the first region. A conductive layer is formed on the substrate in the second region. A top surface of the conductive layer is lower than a top surface of the first dielectric layer. A second dielectric layer is formed on the substrate. A portion of the second dielectric layer and a portion of the conductive layer are removed to form a first opening in the conductive layer and the second dielectric layer in the second region. The first opening exposes a surface of the substrate. A portion of the substrate in the second region is removed to form a trench in the substrate in the second region. A third dielectric layer is formed in the trench and the first opening.

19 Claims, 5 Drawing Sheets

MEMORY DEVICE AND METHOD OF FABRICATING THE SAME

CROSS-REFERENCE TO RELATED APPLICATION

This application claims the priority benefit of China application serial no. 201510909859.9, filed on Dec. 10, 2015. The entirety of the above-mentioned patent application is hereby incorporated by reference herein and made a part of this specification.

BACKGROUND OF THE INVENTION

Field of the Invention

The invention relates to a semiconductor device and a method of fabricating the same, and particularly to a memory device and a method of fabricating the same.

Description of Related Art

In order to improve the integration density of dynamic random access memory (DRAM) to speed up the operation speed of devices and meet the consumer's requirement of miniaturization of electronic devices, buried word line DRAM has been developed to meet the above requirements in recent years. However, with the increase of the integration density of memory, the spacing between word lines and the isolation structure of the memory array may continue reducing resulted in various undesirable influences, such as cell-to-cell leakage, interference between word lines (also called as row hammer), read/write time failure ($t_{wr}$ failure), retention failure, bit line coupling failure, and the like.

Currently, for the interference between word lines, an isolation structure deeper than the buried word lines is a way used to improve the above problems. As a result, it is necessary to change the original process of the isolation structure. That is, one lithography process of forming the word lines and the isolation structure simultaneously changes into at least two lithography processes. One is for fabricating the deeper isolation structure while the other one is for fabricating the buried word line between the isolation structures.

However, in the prior art, alignment issue tends to happen by using multi-lithography processes to form the isolation structure and the capacitor contact respectively. The alignment issue becomes worse with the reduction of device size. For example, it may cause a reduction of a contact area between an active area (e.g. source/drain region) and a capacitor contact. Since the contact area between the active area and the capacitor contact becomes smaller, resistance between the active area and the capacitor contact increases and thereby resulted in read/write time failure. Therefore, how to develop a method of fabricating a memory device to improve the problem of the reduction of the contact area between the active area and the capacitor contact caused by a misalignment in a lithography process becomes an important issue.

SUMMARY OF THE INVENTION

The invention provides a method of fabricating a memory device having a self-aligned isolation structure to improve the problem of the reduction of the contact area between the active area and the capacitor contact caused by the misalignment in the lithography process.

The invention provides a method of fabricating a memory device to reduce the process steps, so as to reduce the process cost.

The invention provides a method of fabricating a memory device includes the following steps. A substrate having a first region and a second region is provided. A plurality of word line sets are formed in the substrate in the first region. Each of the word line sets has two buried word lines. A first dielectric layer is formed on the substrate in the first region. A conductive layer is formed on the substrate in the second region, wherein a top surface of the conductive layer is lower than a top surface of the first dielectric layer. A second dielectric layer is conformally formed on the substrate. A first etching process is performed to remove a portion of the second dielectric layer and a portion of the conductive layer, so as to form a first opening in the conductive layer and the second dielectric layer in the second region. The first opening exposes a surface of the substrate in the second region. A second etching process is performed to remove a portion of the substrate in the second region, so as to form a trench in the substrate in the second region, wherein the first opening is located on the trench. A third dielectric layer is formed in the trench and the first opening. A portion of the first dielectric layer and the third dielectric layer are removed to form a second opening on a remainder of the first dielectric layer and to form a third opening on a remainder of the third dielectric layer. A fourth dielectric layer is formed in the second opening and the third opening.

The invention provides a memory device includes a substrate, at least one word line set, a dielectric structure, a conductive layer, and an isolation structure. The substrate has at least one first region and at least one second region. The at least one word line set is located in the substrate in the at least one first region. The dielectric structure is located on the at least one word line set. The conductive layer is located on the substrate in the at least one second region. The isolation structure is located in the conductive layer. The isolation structure is extended from a top surface of the conductive layer into the substrate. A bottom surface of the isolation structure is lower than a bottom surface of the at least one word line set.

Based on the above description, the isolation structure is formed by forming a self-aligned trench to improve the problem of the reduction of the contact area between the active area and the capacitor contact caused by the misalignment in the lithography process in the invention. In addition, a width of the isolation structure formed subsequently may be adjusted by varying a thickness of the second dielectric layer in the invention. Moreover, the process steps may be simplified to reduce the process cost in the invention.

In order to make the aforementioned features and advantages of the invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
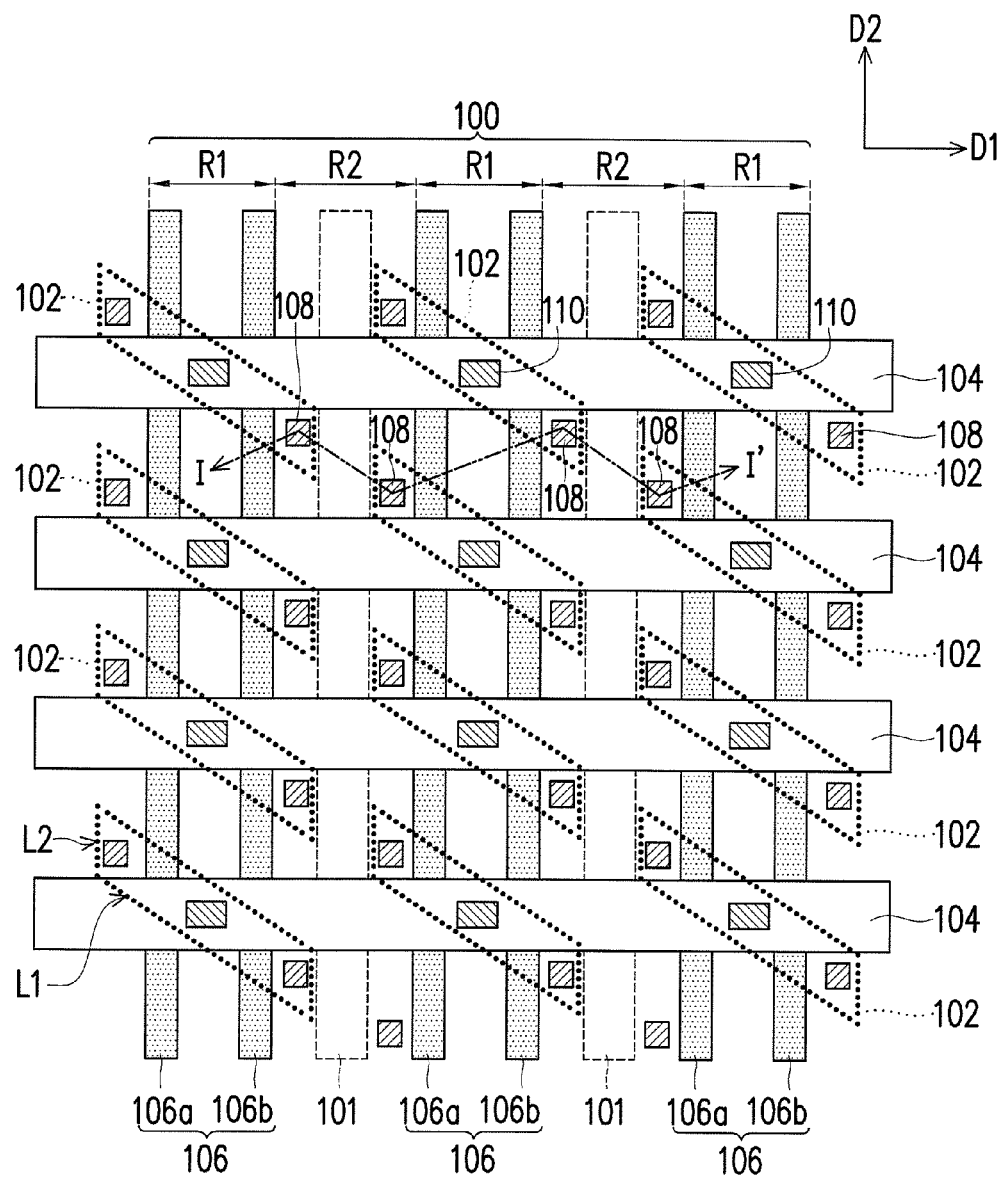
FIG. 1 is a schematic top view of a memory device in accordance with a first embodiment of the invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

FIG. 1 is a schematic top view of a memory device in accordance with a first embodiment of the invention.

Referring to FIG. 1, the embodiment provides a memory device including a substrate 100, a plurality of isolation structures 101, a plurality of active areas 102, a plurality of bit lines 104, a plurality of word line sets 106, a plurality of capacitor contacts 108, and a plurality of bit line contacts 110. For clarity, only the above components are shown in FIG. 1 while other structures may be shown in the following cross-sectional views of FIG. 2A to FIG. 2H.

In the first embodiment, the substrate 100 includes a plurality of first regions R1 and a plurality of second regions R2. The first regions R1 and the second regions R2 are alternatively arranged along a first direction D1. The isolation structures 101 are formed in the substrate 100 in the second regions R2 extending along a second direction D2. The isolation structures 101 may chop a plurality of strip-type active areas alternatively arranged along the second direction D2 to define and form a plurality of the active areas 102. In other words, the isolation structure 101 is formed between two adjacent active areas 102. In the embodiment, the strip-type active area is a linear shape. However, the invention is not limited thereto. In other embodiments, the strip-type active area may be a non-linear shape, such as a zigzag shape.

The bit lines 104 are located on the substrate 100 and cross the first regions R1 and the second regions R2. The bit lines 104 extend along the first direction D1 and are alternatively arranged along the second direction D2. The word line sets 106 are located in the substrate 100 in the first regions R1. The word line sets 106 extend along the second direction D2 and are alternatively arranged along the first direction D1. Each of the word line sets 106 has two buried word lines 106a, 106b. The first direction D1 is different from the second direction D2. In one embodiment, the first direction D1 and the second direction D2 are perpendicular to each other substantially.

In the embodiment, each of the active areas 102 has long sides L1 and short sides L2, and the long sides L1 cross the corresponding word line set 106 (i.e. two buried word lines 106a, 106b). Also, the overlap between each of the active areas 102 and the corresponding bit line 104 has the bit line contact 110. Therefore, each of the bit lines 104 may be electrically connected to the corresponding doped region (not shown) by the bit line contact 110 when crossing the corresponding word line set 106, wherein the doped region is located between the two buried word lines 106a, 106b. In addition, although the bit line contacts 110 are shown as a rectangle in FIG. 1, the contact is formed to be a slight circular shape actually, and the size thereof may be designed according to the process requirement.

The capacitor contacts 108 are located on the substrate 100 between the bit lines 104. Specifically, the capacitor contacts 108 are arranged in a plurality of rows and a plurality of columns. The rows are arranged along the second direction D2 while the columns are arranged along the first direction D1. From another aspect, the capacitor contacts 108 are disposed on the substrate 100 between two sides of the word line sets 106. That is, every two columns of the capacitor contacts 108 and the word line sets 106 having two buried word lines 106, 106b are arranged alternatively along the first direction D1.

FIG. 2A to FIG. 2H are schematic cross-sectional views illustrating a process of fabricating a memory device in accordance with a second embodiment along line I-I' in FIG. 1.

Figure 2A:
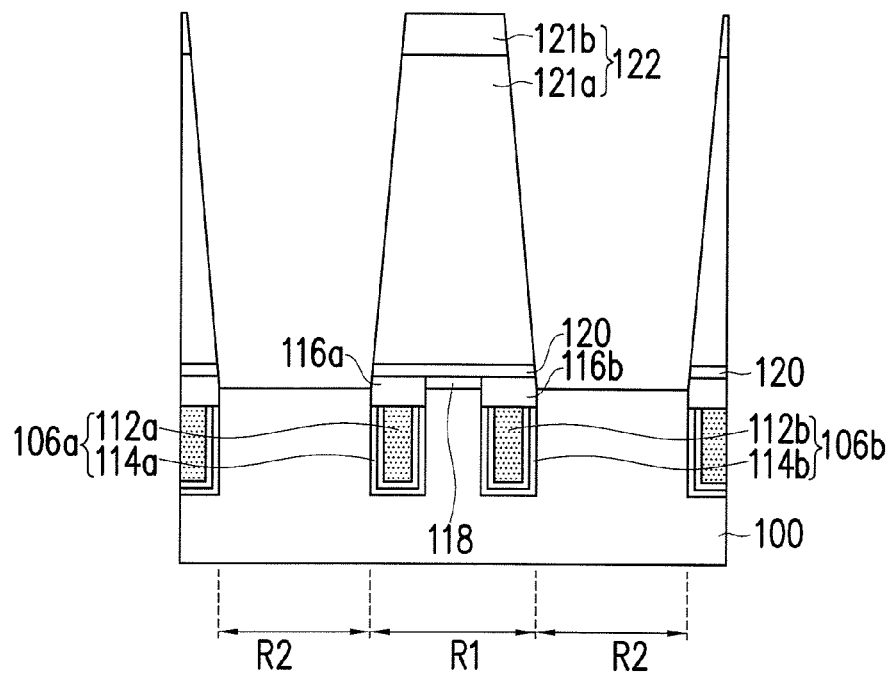
FIG. 2A to FIG. 2H are schematic cross-sectional views illustrating a process of fabricating a memory device in accordance with a second embodiment along line I-I' in FIG. 1.

Referring to FIG. 1 and FIG. 2A at the same time, the invention provides a method of fabricating a memory device including the following steps. First, the substrate 100 is provided. In the embodiment, the substrate 100 may be a semiconductor substrate, a semiconductor compound substrate, or a semiconductor over insulator (SOI) substrate, for example. The substrate 100 has a plurality of the first regions R1 and a plurality of the second regions R2. The first regions R1 and the second regions R2 are arranged alternatively.

Then, a plurality of the word line sets 106 are formed in the substrate 100 in the first regions R1. Specifically, each of the word line sets 106 includes two buried word lines 106, 106b. Each of the buried word lines 106 includes a gate electrode 112a and a gate dielectric layer 114a. The gate dielectric layer 114a is around the gate electrode 112a, so that the gate electrode 112a is electrically isolated from the substrate 100. In one embodiment, a material of the gate electrode 112a includes a conductive material. The conductive material may be a metal material, a barrier metal material, or a combination thereof, for example, and a method of forming the same may be a chemical vapor deposition method or a physical vapor deposition method. A material of the gate dielectric layer 114a may be silicon oxide, for example, and a method of forming the same may be a chemical vapor deposition method, a thermal oxidation method, or an in situ steam generation (ISSG) method, etc. Similarly, another buried word line 106b also includes a gate electrode 112b and a gate dielectric layer 114b. The gate dielectric layer 114b is around the gate electrode 112b, so that the gate electrode 112b is electrically isolated form the substrate 100.

After that, a silicon nitride layer 116a is formed on the buried word line 106a, and a silicon nitride layer 116b is formed on the buried word line 106b. A silicon oxide layer 118 is formed on the substrate 100 between the silicon nitride layers 116a, 116b. A silicon nitride layer 120 is formed on the silicon nitride layers 116a, 116b and the silicon oxide layer 118. In one embodiment, a method of forming the silicon nitride layers 116a, 116b, the silicon oxide layer 118, and the silicon nitride layer 120 may be a chemical vapor deposition method.

Then, a first dielectric layer 112 is formed on the substrate 100 in the first regions R1. The first dielectric layer 112 includes dielectric material layers 121a, 121b. In one embodiment, a material of the dielectric material layer 121a may be a spin-on dielectric (SOD) material, for example. A material of the dielectric material layer 121b may be tetraethoxysilane (TEOS), for example. However, the invention is not limited thereto. A material of the first dielectric layer 122 may be a combination of one or more dielectric materials.

Figure 2B:
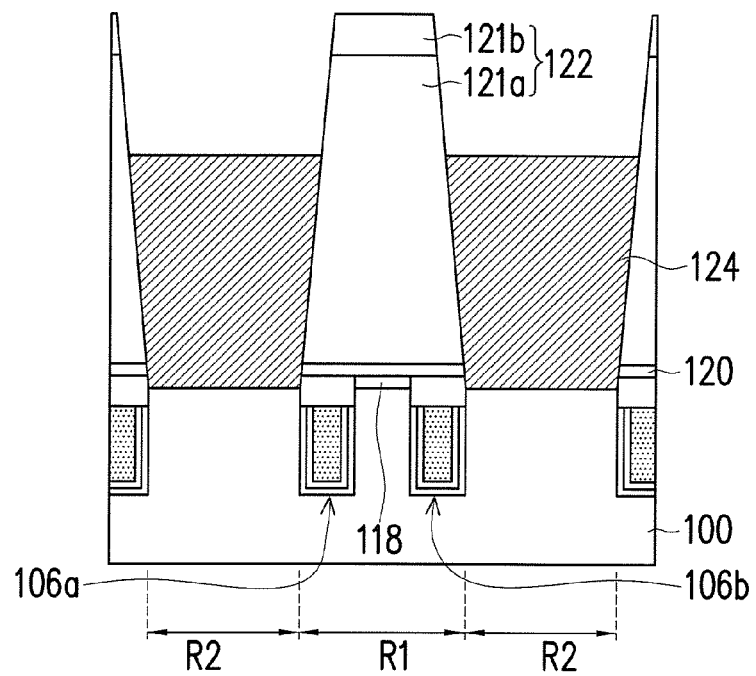

Referring to FIG. 1 and FIG. 2B at the same time, a conductive layer 124 is formed on the substrate 100 in the second regions R2, wherein a top surface of the conductive layer 124 is lower than a top surface of the first dielectric layer 122. Particularly, steps of forming the conductive layer 124 include forming a conductive material layer (not shown) on the substrate 100 first. The conductive material layer not only covers a surface of the substrate 100 in the second regions R2, but covers a top surface and sidewalls of the first dielectric layer 122. Next, an etch back process is performed to remove a portion of the conductive material layer, so as to expose the top surface and a portion of the sidewalls of the first dielectric layer 122. In one embodiment, a material of the conductive layer 124 may be doped polycrystalline silicon, for example, and a method of forming the same may be a chemical vapor deposition method.

Figure 2C:
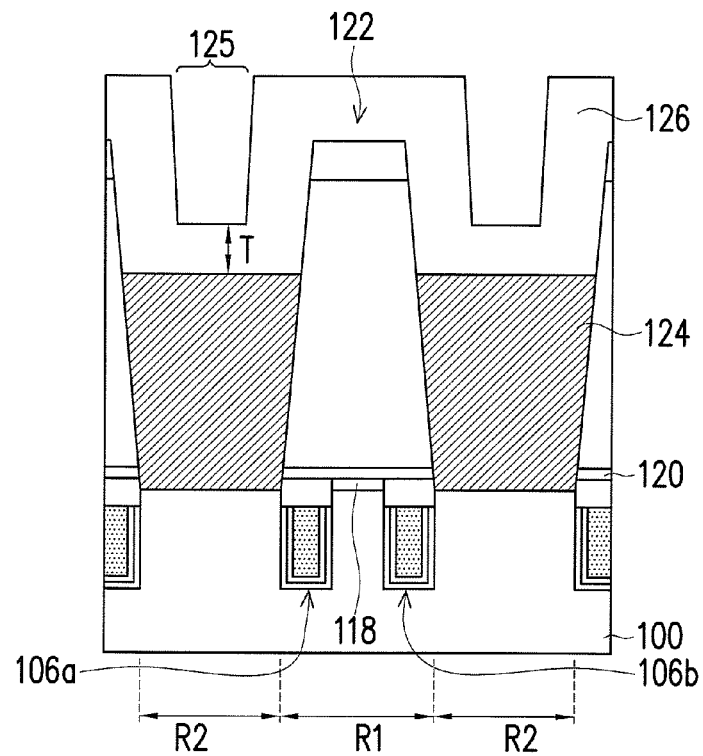

Then, referring to FIG. 1 and FIG. 2C at the same time, a second dielectric layer 126 is conformally formed on the substrate 100. Since the top surface of the conductive layer 124 is lower than the top surface of the first dielectric layer 122, the second dielectric layer 126 may be a continuous concave and convex structure, for example. The second dielectric layer 126 on the first dielectric layer 122 is a convex portion while the second dielectric layer 126 on the conductive layer 124 is a concave portion. In one embodiment, a material of the second dielectric layer 126 may be silicon nitride, for example, and a method of forming the same may be an atomic layer deposition (ALD) method.

Figure 2D:
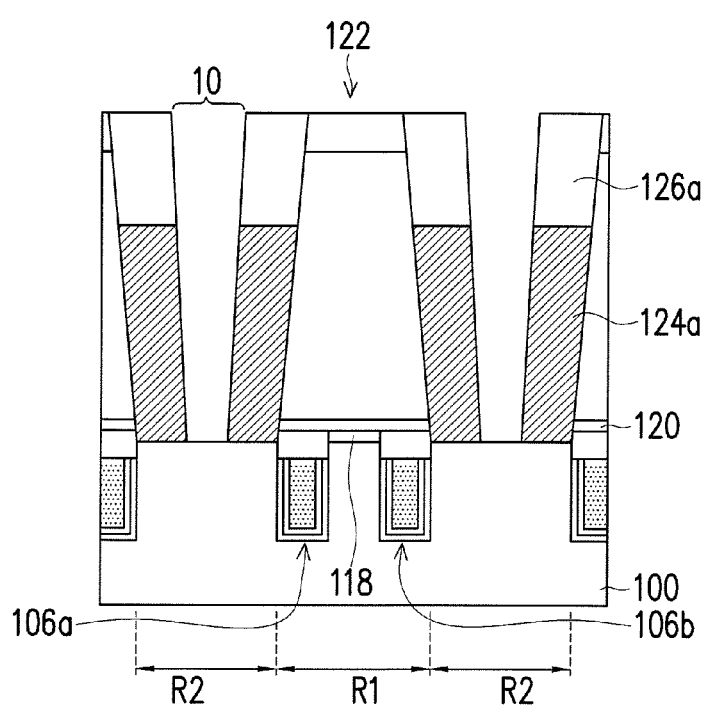
Figure 2E:
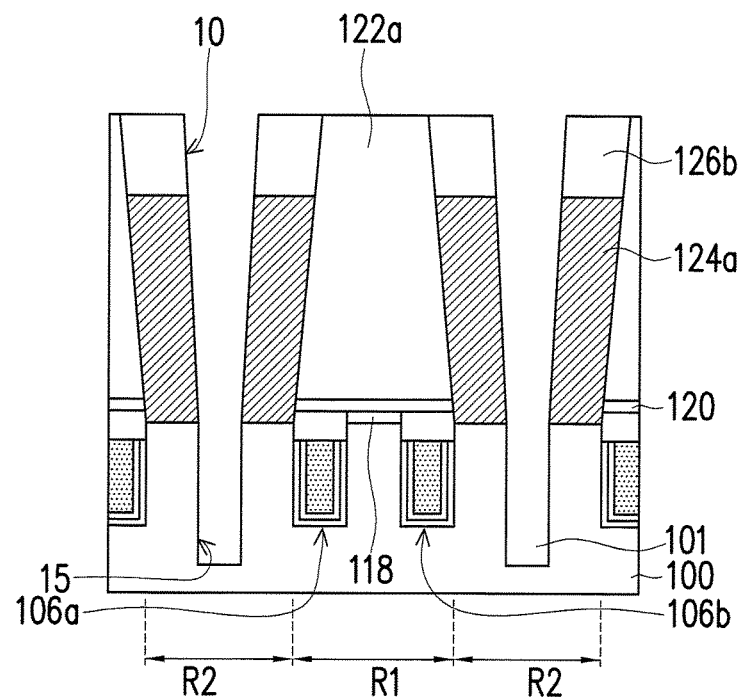
Figure 2F:
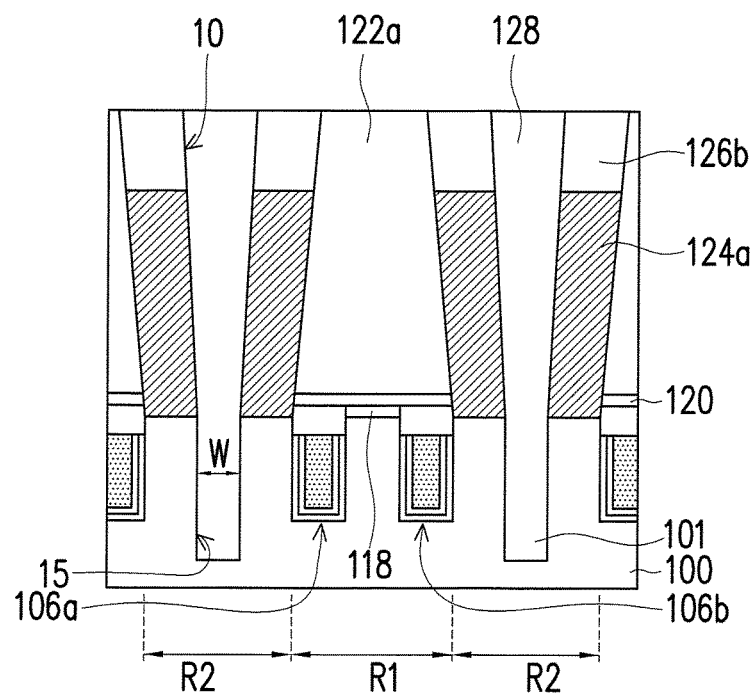

It should be noted that, in the embodiment, a width W (as shown in FIG. 2F) of the isolation structure 101 formed subsequently may be adjusted by varying a thickness T of the second dielectric layer 126. For example, a width of a concave portion opening 125 on the conductive layer 124 is smaller when the thickness T of the second dielectric layer 126 is thicker. Then, widths of a first opening 10 and a trench 15 (as shown in FIG. 2E) formed after performing the first etching process and the second etching process become smaller. Therefore, the width W of the isolation structure 101 located in the trench 15 is smaller and vice versa.

Then, referring to FIG. 1 and FIG. 2D at the same time, a first etching process is performed to remove a portion of the second dielectric layer 126 and a portion of the conductive layer 124, so as to form the first opening 10 in the conductive layer 124a and the second dielectric layer 126a in the second regions R2. The first opening 10 exposes a surface of the substrate 100 in the second regions R2. In addition, when the first etching process is performed, a portion of the second dielectric layer 126 in the first regions R1 is also removed to expose a top surface of the first dielectric layer 122. From another aspect, the conductive layer 124 is separated into two conductive layers 124a by the first opening 10. In one embodiment, the first etching process may be a one-step process, a two-step process, or a multi-step process.

Referring to FIG. 1 and FIG. 2E at the same time, a second etching process is performed to remove a portion of the substrate 100 in the second regions R2, so as to form the trench 15 in the substrate 100 in the second regions R2. The first opening 10 is located on the trench 15. In the embodiment, etching selectivity of the material (e.g. silicon) of the substrate 100 to the second etching process may be higher by adjusting process parameters (e.g. etching gas composition or proportion, etc.) of the second etching process. Thus, the second etching process is performed by using the first dielectric layer 122 and the second dielectric layer 126a as a mask layer, most of the substrate 100 may be removed to form the self-aligned trench 15. In one embodiment, a small part of the first dielectric layer 122 and the second dielectric layer 126a are still removed in the second etching process, but the formation of the self-aligned trench 15 is not affected thereby. Here, the first dielectric layer 122 and the second dielectric layer 126a removed by the second etching process are represented as the first dielectric layer 122a and the second dielectric layer 126b. In one embodiment, a bottom surface of the trench 15 is lower than bottom surfaces of the buried word lines 106a, 106b.

Referring to FIG. 1 and FIG. 2F at the same time, a third dielectric layer 128 is formed in the trench 15 and the first opening 10. Particularly, steps of forming the third dielectric layer 128 include forming a third dielectric material layer (not shown) on the substrate 100 first. The third dielectric material layer is not only filled in the trench 15 and the first opening 10, but also covers a top surface of the first dielectric layer 122a and a top surface of the second dielectric layer 126b. A chemical mechanical polishing (CMP) process is performed to remove a portion of the third dielectric material layer, so as to expose the top surface of the first dielectric layer 122a or the top surface of the second dielectric layer 126b, thereby the top surface of the first dielectric layer 122a is coplanar with the top surface of the second dielectric layer 126b. In one embodiment, a material of the third dielectric layer 128 may be silicon oxide or a spin-on dielectric (SOD) material, for example. However, the invention is not limited thereto. Only if a dielectric material having good gap filling capacity is suitable. In one embodiment, the third dielectric layer 128 filled in the trench 15 may be the isolation structure 101, for example. A bottom surface of the isolation structure 101 is lower than the bottom surfaces of the buried word lines 106a, 106b to improve the interference between the word lines.

Figure 2G:
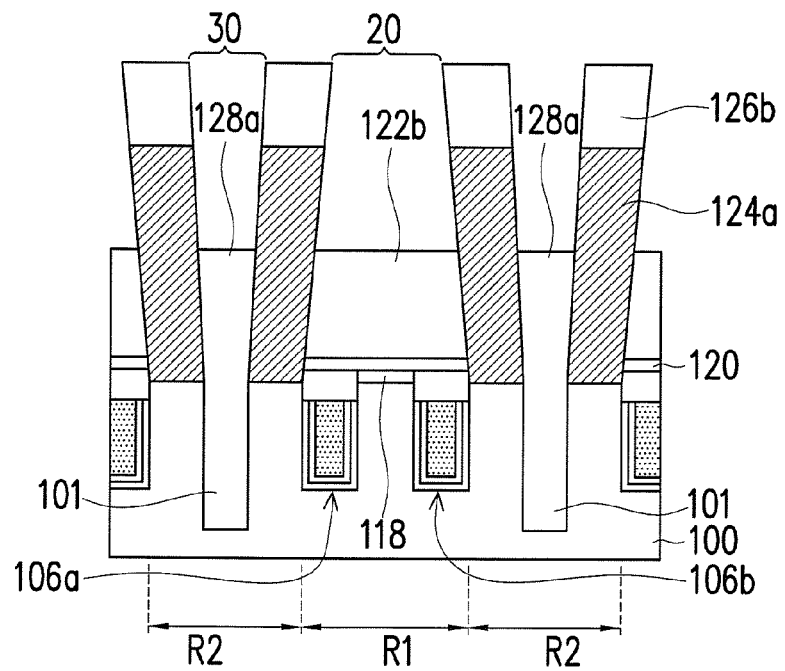

Referring to FIG. 1 and FIG. 2G at the same time, a portion of the first dielectric layer 122a and the third dielectric layer 128 are removed to form a second opening 20 on a remainder of the first dielectric layer 122b and to form a third opening 30 on a remainder of the third dielectric layer 128a. A bottom surface of the second opening 20 is coplanar with a bottom surface of the third opening 30. In other word, the remainder of the first dielectric layer 122b and the remainder of the third dielectric layer 128a have the same level. In one embodiment, a method of removing the portion of the first dielectric layer 122a and the third dielectric layer 128 may be a wet etching method, for example.

Figure 2H:
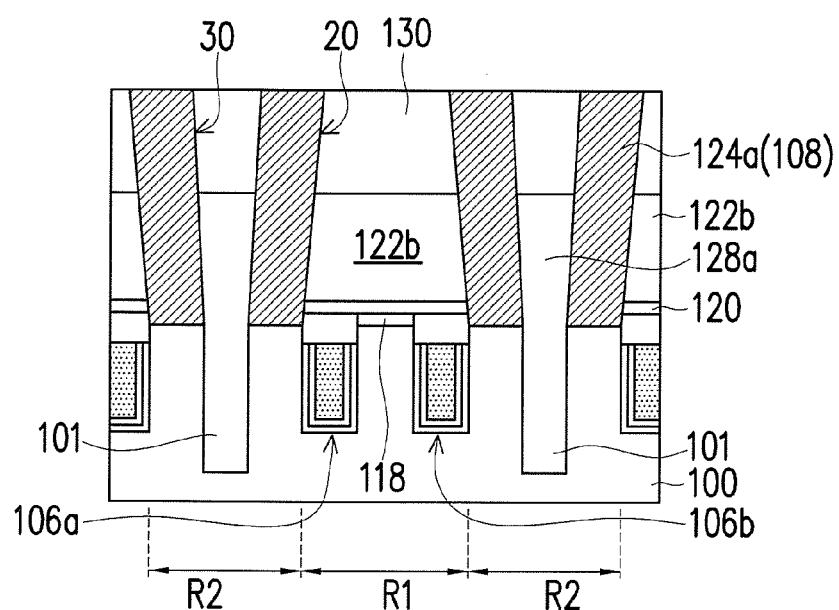

Referring to FIG. 1, FIG. 2G, and FIG. 2H at the same time, a fourth dielectric layer 130 is formed in the second opening 20 and the third opening 30. Since the fourth dielectric layer 130 is disposed on the first dielectric layer 122b and the third dielectric layer 128a, and the fourth dielectric layer 130 may be used as an etching stop layer. Therefore, when a capacitor (not shown) formed subsequently, problems of the depletion of the first dielectric layer 122b and the isolation structure 101 caused by over etching does not happen. Particularly, a fourth dielectric material layer (not shown) is conformally formed on the substrate 100 first. The fourth dielectric material layer is filled in the second opening 20 and the third opening 30 and covers a top surface of the second dielectric layer 126b. A planarization process is performed to remove a portion of the fourth dielectric material layer and the second dielectric layer 126b, so that a top surface of the fourth dielectric layer 130 is coplanar with a top surface of the conductive layer 124a. In one embodiment, a material of the fourth dielectric layer 130 may be silicon nitride, for example, and a method of forming the same may be an atomic layer deposition (ALD) method, for example. In one embodiment, the planarization process may be a CMP process or an etch back process, for example. In one embodiment, the conductive layer 124a may be the capacitor contact 108, for example. After that, a plurality of capacitors (not shown) may be formed on the conductive layer 124a (or the capacitor contact 108) respectively.

In summary, the isolation structure is formed by forming the self-aligned trench to improve the problem of the reduction of the contact area between the active area and the capacitor contact caused by the misalignment in the lithography process in the invention. In addition, the width of the isolation structure formed subsequently may be adjusted by varying the thickness of the second dielectric layer in the invention. Moreover, the process steps may be simplified to reduce the process cost in the invention.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of fabricating a memory device, comprising:
providing a substrate having a first region and a second region;
forming a plurality of word line sets in the substrate in the first region, wherein each of word line sets has two buried word lines;
forming a first dielectric layer on the substrate in the first region;
forming a conductive layer on the substrate in the second region, wherein a top surface of the conductive layer is lower than a top surface of the first dielectric layer;
forming a second dielectric layer on the substrate conformally;
performing a first etching process to remove a portion of the second dielectric layer and a portion of the conductive layer, so as to form a first opening in the conductive layer and the second dielectric layer in the second region, wherein the first opening exposes a surface of the substrate in the second region;
performing a second etching process to remove a portion of the substrate in the second region, so as to form a trench in the substrate in the second region, wherein the first opening is located on the trench;
forming a third dielectric layer in the trench and the first opening;
removing a portion of the first dielectric layer and the third dielectric layer to form a second opening on a remainder of the first dielectric layer and to form a third opening on a remainder of the third dielectric layer; and
forming a fourth dielectric layer in the second opening and the third opening.

2. The method of fabricating the memory device according to claim 1, wherein a material of the first dielectric layer comprises tetraethoxysilane (TEOS), spin-on dielectric (SOD) materials, or a combination thereof.

3. The method of fabricating the memory device according to claim 1, wherein a material of the conductive layer comprises doped polycrystalline silicon.

4. The method of fabricating the memory device according to claim 1, wherein a material of the second dielectric layer comprises silicon nitride, and a method of forming the second dielectric layer comprises an atomic layer deposition (ALD) method.

5. The method of fabricating the memory device according to claim 1, wherein a material of the third dielectric layer comprises silicon oxide.

6. The method of fabricating the memory device according to claim 1, wherein a material of the fourth dielectric layer comprises silicon nitride, and a method of forming the fourth dielectric layer comprises an atomic layer deposition (ALD) method.

7. The method of fabricating the memory device according to claim 1, wherein the first etching process comprises a one-step process, a two-step process, or a multi-step process.

8. The method of fabricating the memory device according to claim 1, wherein performing the first etching process comprises removing a portion of the second dielectric layer in the first region to expose a top surface of the first dielectric layer.

9. The method of fabricating the memory device according to claim 1, wherein a bottom surface of the second opening is coplanar with a bottom surface of the third opening.

10. The method of fabricating the memory device according to claim 1, wherein forming the fourth dielectric layer in the second opening and the third opening comprises:
forming a fourth dielectric material layer on the substrate conformally, wherein the fourth dielectric material layer is filled in the second opening and the third opening and covers a top surface of the second dielectric layer; and
performing a planarization process to remove a portion of the fourth dielectric material layer and the second dielectric layer, so that a top surface of the fourth dielectric layer is coplanar with the top surface of the conductive layer.

11. A memory device, comprising: a substrate having at least one first region and at least one second region; at least one word line set located in the substrate in the at least one first region; a dielectric structure located on the at least one word line set, the dielectric structure comprises a first dielectric layer and a second dielectric layer located on the entire top surface of the first dielectric layer, wherein a material of the first dielectric layer and a material of the second dielectric layer are different; a conductive layer located on the substrate in the at least one second region; and an isolation structure located in the conductive layer, wherein the isolation structure is extended from a top surface of the conductive layer into the substrate, and a bottom surface of the isolation structure is lower than a bottom surface of the at least one word line set.

12. The memory device according to claim 11, wherein the material of the first dielectric layer comprises tetraethoxysilane (TEOS), spin-on dielectric (SOD) materials, or a combination thereof.

13. The memory device according to claim 11, wherein the material of the second dielectric layer comprises silicon nitride.

14. The memory device according to claim 11, wherein the isolation structure comprises a third dielectric layer and a fourth dielectric layer located on the third dielectric layer, wherein a material of the third dielectric layer and a material of the fourth dielectric layer are different.

15. The memory device according to claim 14, wherein the material of the third dielectric layer comprises silicon oxide, spin-on dielectric (SOD) materials, or a combination thereof.

16. The memory device according to claim 14, wherein the material of the fourth dielectric layer comprises silicon nitride.

17. The memory device according to claim 14, wherein an interface between the first dielectric layer and second dielectric layer and an interface between the third dielectric layer and fourth dielectric layer are located at the same level.

18. The memory device according to claim 11, wherein the at least one word line set comprises two buried word lines, and each of two buried word lines has a gate electrode and a gate dielectric layer, wherein the gate dielectric layer is around the gate electrode, so that the gate electrode is electrically isolated from the substrate.

19. The memory device according to claim 11, wherein the number of the at least one first region is plural and the number of the at least one second region is plural, wherein the first regions and the second regions are alternatively arranged.

* * * * *